(12) United States Patent
Do

(10) Patent No.: US 10,903,189 B2
(45) Date of Patent: Jan. 26, 2021

(54) STACK PACKAGES INCLUDING STACKED SEMICONDUCTOR DIES

(71) Applicant: SK hynix Inc., Icheon-si (KR)

(72) Inventor: Eun Hye Do, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/230,491

(22) Filed: Dec. 21, 2018

(65) Prior Publication Data

US 2020/0091112 A1 Mar. 19, 2020

(30) Foreign Application Priority Data

Sep. 19, 2018 (KR) ........................ 10-2018-0112410

(51) Int. Cl.
*H01L 25/065* (2006.01)
*H01L 23/00* (2006.01)
*H01L 23/31* (2006.01)

(52) U.S. Cl.
CPC ...... *H01L 25/0652* (2013.01); *H01L 23/3114* (2013.01); *H01L 23/3128* (2013.01); *H01L 24/09* (2013.01); *H01L 24/17* (2013.01); *H01L 24/33* (2013.01); *H01L 24/49* (2013.01); *H01L 24/73* (2013.01); *H01L 2224/48145* (2013.01); *H01L 2224/49175* (2013.01); *H01L 2224/97* (2013.01)

(58) Field of Classification Search
CPC . H01L 2224/32145; H01L 2224/49175; H01L 2224/97; H01L 2225/06562; H01L 2224/48145; H01L 25/0657; H01L 2225/0651; H01L 25/0652; H01L 2224/16145
USPC ........... 257/686, 723, 777, E23.01, E23.085, 257/E25.013; 438/107, 109
See application file for complete search history.

(56) References Cited

U.S. PATENT DOCUMENTS

| | | | | |
|---|---|---|---|---|
| 2004/0196635 | A1* | 10/2004 | Park | H01L 23/3128 361/707 |
| 2010/0289131 | A1* | 11/2010 | Bathan | H01L 21/568 257/686 |
| 2013/0161788 | A1* | 6/2013 | Chun | H01L 24/05 257/532 |
| 2016/0329271 | A1* | 11/2016 | Katti | H01L 25/0652 |
| 2017/0358564 | A1* | 12/2017 | Lee | H01L 25/0657 |
| 2018/0005994 | A1* | 1/2018 | Oh | H01L 25/50 |

FOREIGN PATENT DOCUMENTS

| | | |
|---|---|---|
| KR | 1020110124065 A | 11/2011 |
| KR | 1020130005465 A | 1/2013 |

\* cited by examiner

*Primary Examiner* — David Chen
(74) *Attorney, Agent, or Firm* — William Park & Associates Ltd.

(57) ABSTRACT

A stack package includes a second semiconductor die stacked on the first semiconductor die, a third semiconductor die disposed on the lifting supporter. The third semiconductor die vertically and partially overlapping with the second semiconductor die.

11 Claims, 11 Drawing Sheets

STACK PACKAGES INCLUDING STACKED SEMICONDUCTOR DIES

CROSS-REFERENCE TO RELATED APPLICATIONS

The present application claims priority under 35 U.S.C 119(a) to Korean Application No. 10-2018-0112410, filed on Sep. 19, 2018, which is incorporated herein by references in its entirety.

BACKGROUND

1. Technical Field

The present disclosure relates to semiconductor package technologies and, more particularly, to stack packages including stacked semiconductor dies.

2. Related Art

Semiconductor devices have been employed in various electronic systems. The semiconductor devices may be processed to provide semiconductor dies, and the semiconductor dies may be encapsulated to provide semiconductor packages which are employed in the electronic systems. Each of the semiconductor dies may include integration circuits for storing or processing data and may be protected by a molding layer to provide the semiconductor package.

Highly integrated memory devices are increasingly in demand with the development of smaller electronic systems such as compact mobile systems. Accordingly, the semiconductor packages employed in the mobile systems have been developed to increase their capacity with a compact size.

SUMMARY

According to an embodiment, a stack package may include a first semiconductor die disposed on a package substrate, a second semiconductor die stacked on the first semiconductor die, a lifting supporter disposed on the package substrate to be laterally spaced apart from the second semiconductor die, a third semiconductor die disposed on the lifting supporter, the third semiconductor die vertically and partially overlapping with the second semiconductor die, and a fourth semiconductor die stacked on the third semiconductor die.

According to an embodiment, a stack package may include a first semiconductor die disposed on a package substrate to include first bonding pads, a second semiconductor die vertically stacked on the first semiconductor die to include second bonding pads, first bonding wires electrically connecting the first bonding pads to the package substrate, a first adhesive layer disposed between the first and second semiconductor dies to raise the second semiconductor die and the first adhesive layer expanding to cover the first bonding pads and portions of the first bonding wires bonded to the first bonding pads, a third semiconductor die having an edge region that is stacked on an edge region of the second semiconductor die to vertically overlap with the edge region of the second semiconductor die and including third bonding pads disposed on a body of the third semiconductor die, a fourth semiconductor die vertically stacked on the third semiconductor die to include fourth bonding pads, third bonding wires electrically connecting the third bonding pads to the package substrate, a second adhesive layer disposed between the third and fourth semiconductor dies to raise the fourth semiconductor die and expanding to cover the third bonding pads and portions of the third bonding wires bonded to the third bonding pads, and a lifting supporter disposed between the third semiconductor die and the package substrate to raise the third semiconductor die.

According to an embodiment, a stack package may include a stack structure having a width including a first stack structure including first and second semiconductor dies that are stacked with each other and having a second width, and a second stack structure including third and fourth semiconductor dies that are stacked with each other and having a third width. The first and second stack structures vertically overlap with each other by a first width to provide the width of the stack structure which is the sum of the first and second widths less the third width.

DETAILED DESCRIPTION

Figure 1:
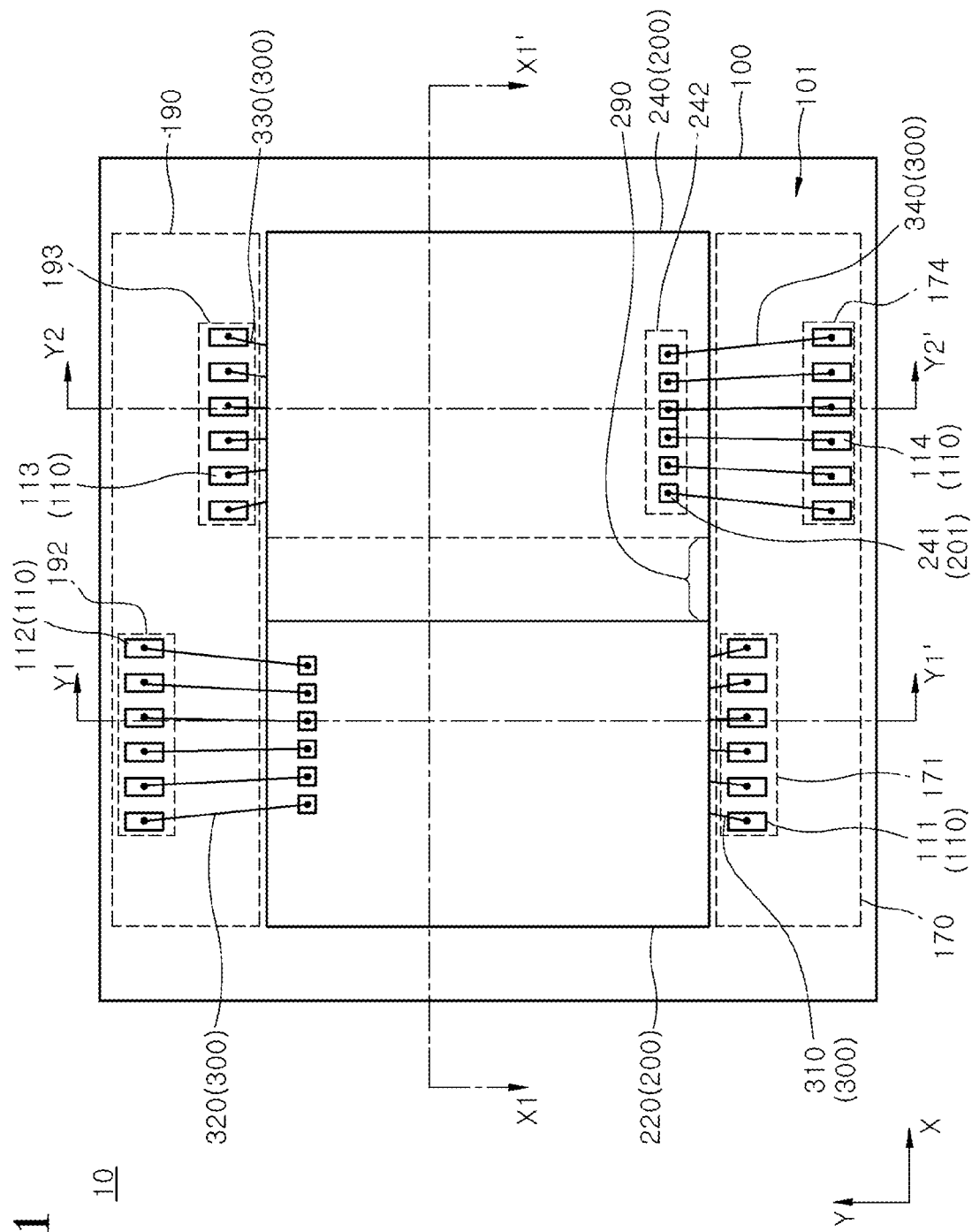
FIG. 1 is a plan view illustrating a stack package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
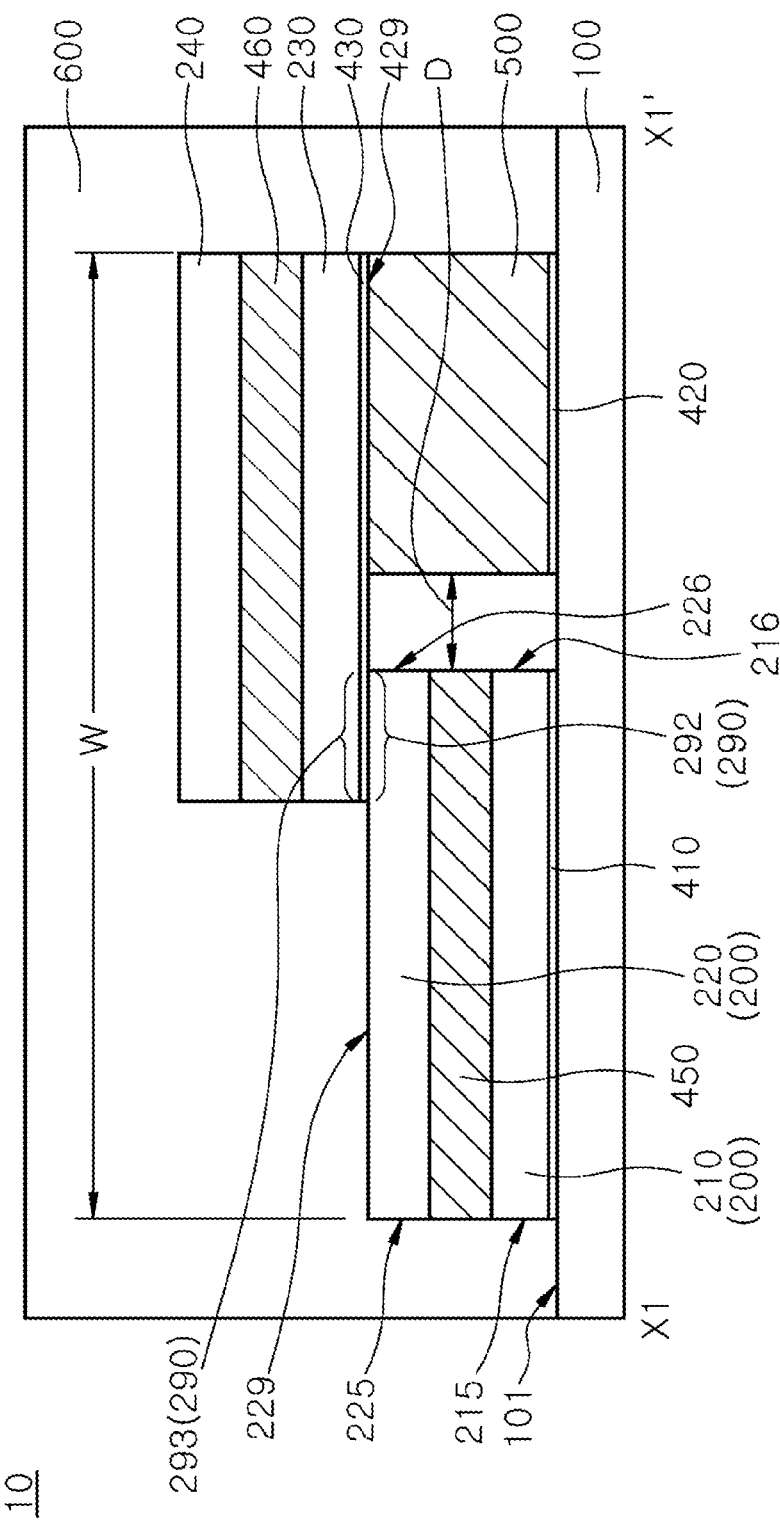
FIGS. 2 to 4 are cross-sectional views illustrating a stack package according to an embodiment.
Figure 3:
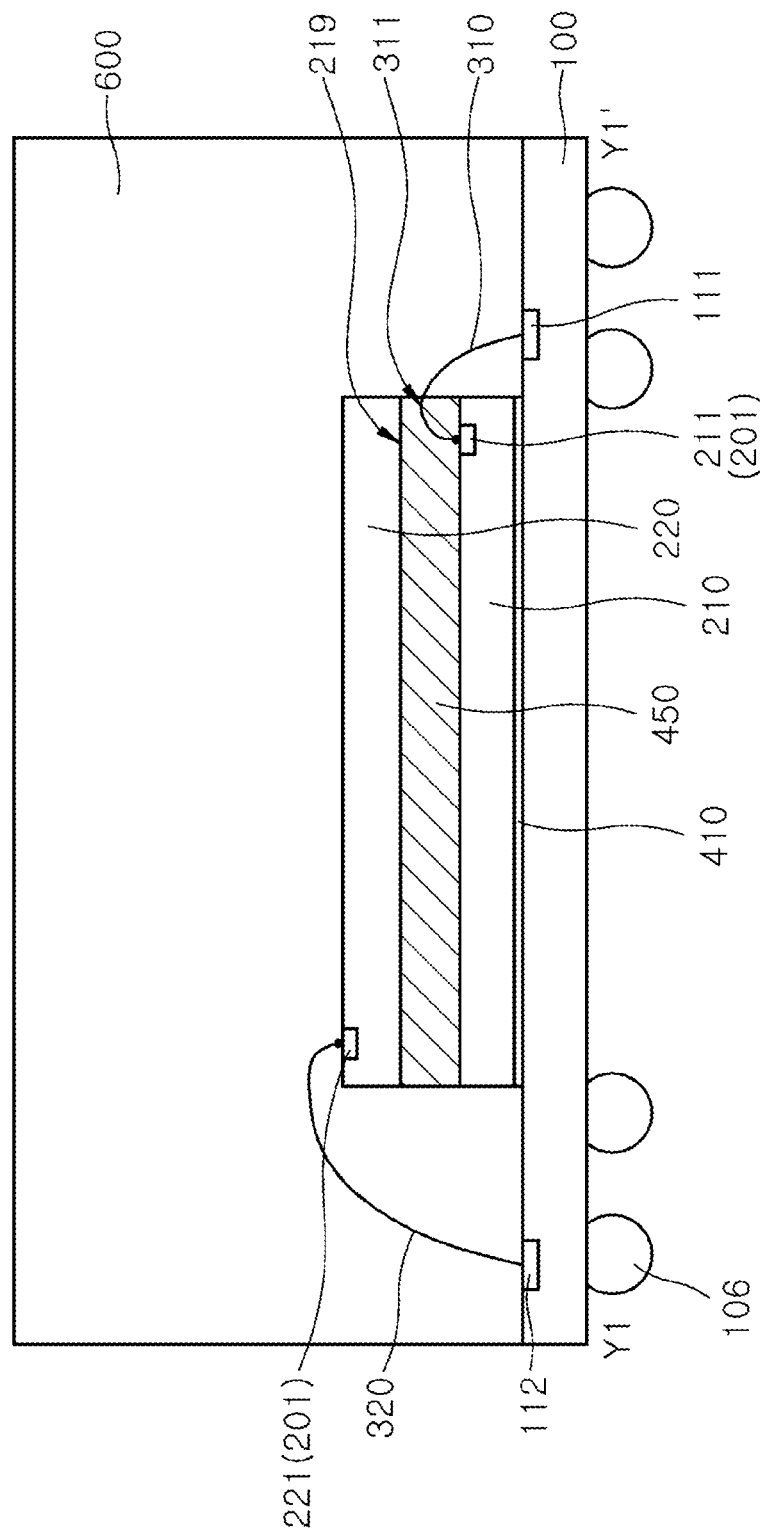
Figure 4:
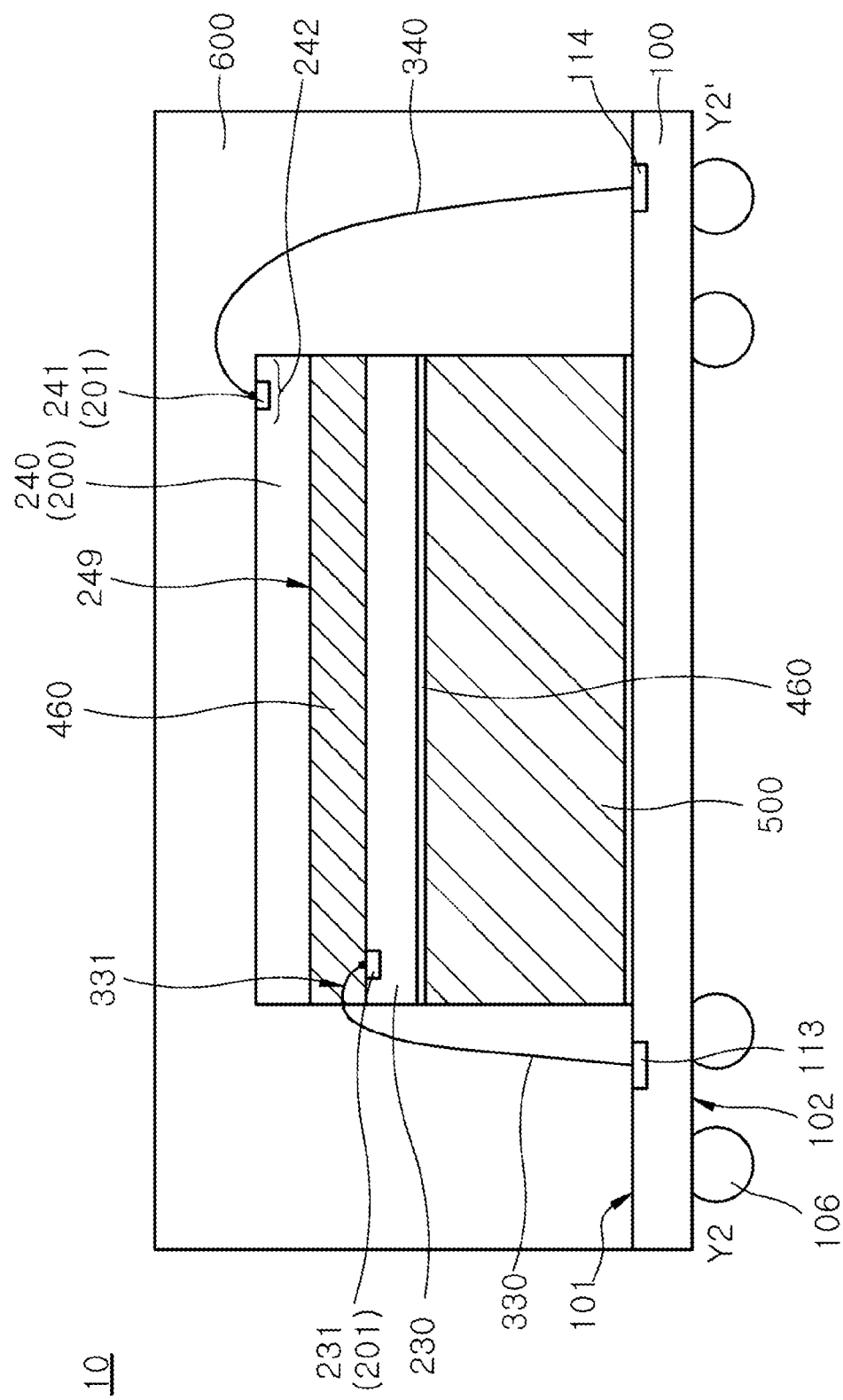
Figure 5:
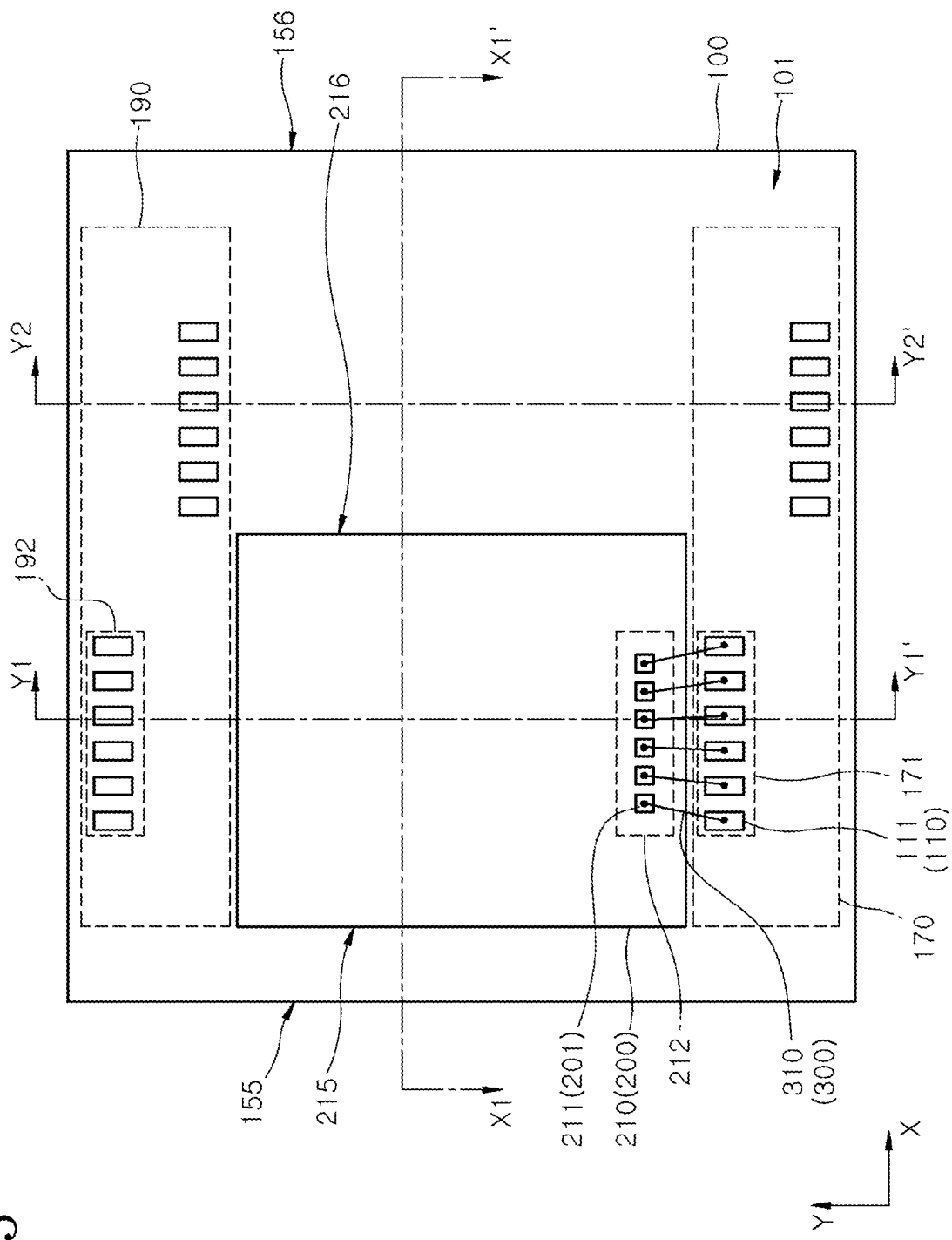
FIGS. 5 to 7 are plan views illustrating semiconductor dies included in a stack package according to an embodiment.
Figure 6:
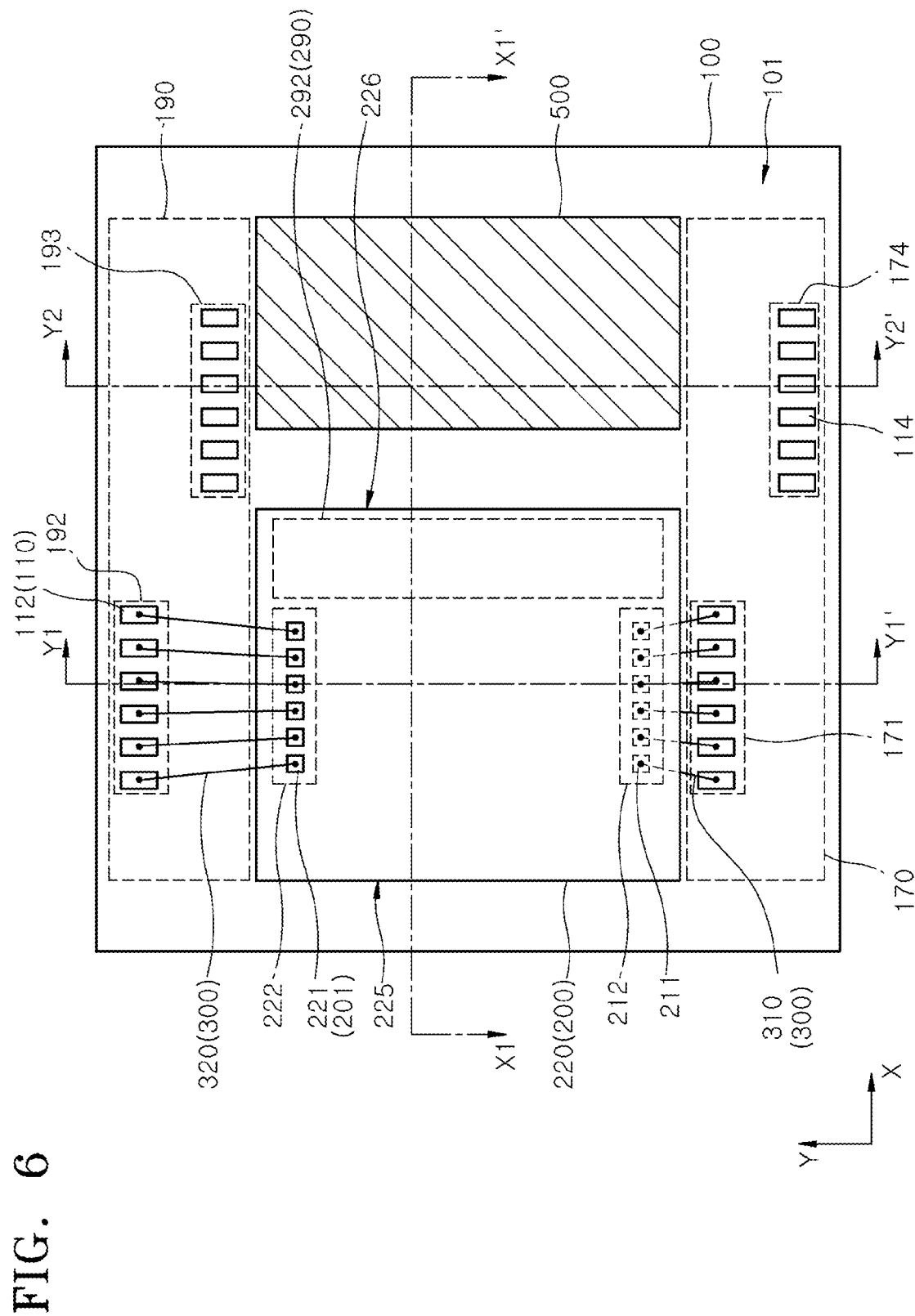
Figure 7:
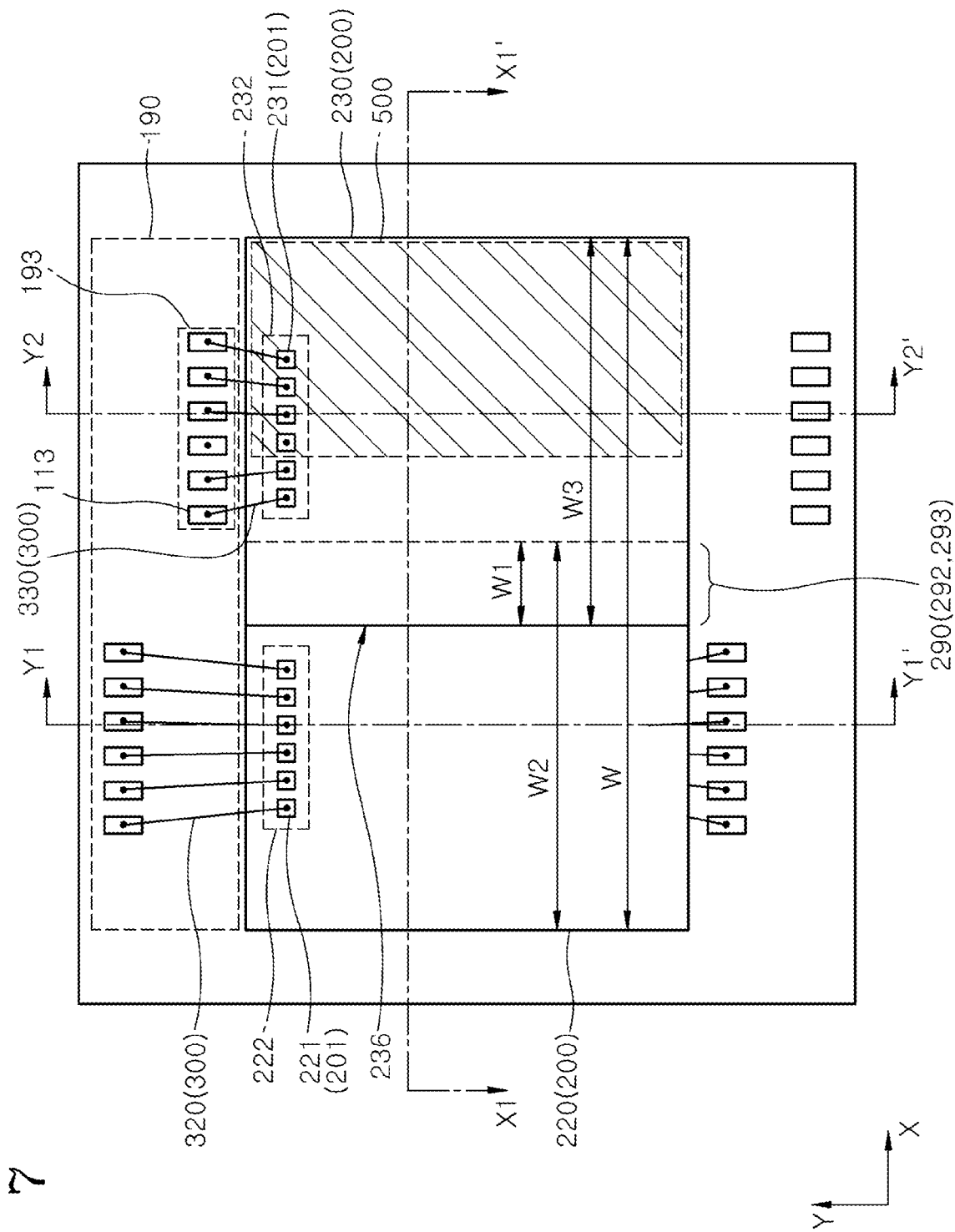

FIG. 1 is a plan view illustrating a stack package 10 according to an embodiment. FIGS. 2 to 4 are cross-sectional views illustrating the stack package 10 illustrated in FIG. 1. FIG. 2 is a cross-sectional view taken along a line X1-X1' of FIG. 1. FIG. 3 is a cross-sectional view taken along a line Y1-Y1' of FIG. 1. FIG. 4 is a cross-sectional view taken along a line Y2-Y2' of FIG. 1. FIGS. 5 to 7 are plan views illustrating semiconductor dies included in the stack package 10 illustrated in FIG. 1.

Referring to FIG. 1, the semiconductor package 10 according to an embodiment may include a plurality of semiconductor dies 200 stacked on a package substrate 100. The semiconductor dies 200 may include at least four semiconductor dies. Each of the semiconductor dies 200 may include various integrated circuits. The semiconductor dies 200 may be memory semiconductor dies such as DRAM dies. The semiconductor dies 200 may have the same function and configuration. Alternatively, at least one of the semiconductor dies 200 may have a function or a shape which is different from the remaining dies.

The package substrate 100 may include a base portion on a surface of which the semiconductor dies 200 are mounted. The base portion of the package substrate 100 may include an interconnection structure which is electrically connected to the semiconductor dies 200. The package substrate 100 may include a conductive trace structure and may be electrically connected to the semiconductor dies 200 through the conductive trace structure. The package substrate 100 may include various metal layers providing conductive traces constituting the conductive trace structure and various dielectric layers electrically insulating the various metal layers from each other. Each of the dielectric layers may include an epoxy resin material with or without fiberglass. The package substrate 100 may be a printed circuit board (PCB).

The package substrate 100 may have a first surface 101 on which conductive lands 110 electrically connected to the semiconductor dies 200 are disposed. Connection members such as bonding wires 300 may be provided to electrically connect the conductive lands 110 to bonding pads 201 of the semiconductor dies 200. The conductive lands 110 may be included in the conductive trace structure of the package substrate 100. The bonding pads 201 may be disposed on the semiconductor dies 200 to act as conductive members electrically connecting the semiconductor dies 200 to the package substrate 100.

The first surface 101 of the package substrate 100 may have a first substrate edge region 170 and a second substrate edge region 190 that are opposite to each other. The first substrate edge region 170 and the second substrate edge region 190 may be disposed to be spaced apart from each other in a Y-axis direction when viewed from an X-Y plane. The semiconductor dies 200 may be disposed on a region between the first and second substrate edge regions 170 and 190. The semiconductor dies 200 may be stacked on a portion of the first surface 101 of the package substrate 100 to reveal the first and second substrate edge regions 170 and 190.

A first land region 171 may be disposed in the first substrate edge region 170 of the package substrate 100 in a plan view, and first lands 111 among the conductive lands 110 may be disposed in the first land region 171 in a plan view. In addition, a fourth land region 174 may also be disposed in the first substrate edge region 170 of the package substrate 100 to be spaced apart from the first land region 171 in a plan view, and fourth lands 114 among the conductive lands 110 may be disposed in the fourth land region 174 in a plan view. Since the first and fourth land regions 171 and 174 are spaced apart from and distinct from each other, the first lands 111 may be grouped to provide a first group and the fourth lands 114 may be grouped to provide a second group which is separated from the first group. The first and fourth land regions 171 and 174 may be spaced apart from each other in an X-axis direction intersecting the Y-axis direction. Thus, the first lands 111 may also be spaced apart from the fourth lands 114 in the X-axis direction.

A second land region 192 may be disposed in the second substrate edge region 190 of the package substrate 100 in a plan view, and second lands 112 among the conductive lands 110 may be disposed in the second land region 192 in a plan view. In addition, a third land region 193 may also be disposed in the second substrate edge region 190 of the package substrate 100 to be spaced apart from the second land region 192 in a plan view, and third lands 113 among the conductive lands 110 may be disposed in the third land region 193 in a plan view. Since the second and third land regions 192 and 193 are spaced apart from and distinct from each other, the second lands 112 may be grouped to provide a second group and the third lands 113 may be grouped to provide a third group which is separated from the second group. The second and third land regions 192 and 193 may be spaced apart from each other in the X-axis direction. Thus, the second lands 112 may also be spaced apart from the third lands 113 in the X-axis direction.

Referring to FIGS. 1 and 5, a first semiconductor die 210 of the semiconductor dies 200 may be disposed on a region between the first land region 171 and the second land region 192 of the package substrate 100. FIG. 5 illustrates a planar shape of the first semiconductor die 210 disposed on the first surface 101 of the package substrate 100. Referring to FIGS. 2 and 5, the first semiconductor die 210 may be attached to the first surface 101 of the package substrate 100 using a fourth adhesive layer 410.

Referring again to FIG. 5, the first semiconductor die 210 may include first bonding pads 211 that belong to the bonding pads 201, and the first bonding pads 211 may be disposed on a body of the first semiconductor die 210 to electrically connect the first semiconductor die 210 to the package substrate 100. The first bonding pads 211 may be disposed on a first edge region 212 of the first semiconductor die 210. The first bonding pads 211 may be arrayed along the X-axis direction. The first semiconductor die 210 may be disposed on the first surface 101 of the package substrate 100 such that the first bonding pads 211 are adjacent to the first lands 111. The first edge region 212 of the first semiconductor die 210 may be located to be adjacent to the first substrate edge region 170 of the package substrate 100. The first bonding pads 211 of the first semiconductor die 210 may be electrically connected to the first lands 111 of the package substrate 100 through first bonding wires 310 of the bonding wires 300.

The first semiconductor die 210 may be disposed on the package substrate 100 such that a first side edge 215 of the first semiconductor die 210 is adjacent to a first side edge 155 of the package substrate 100 and a second side edge 216 of the first semiconductor die 210 opposite to the first side edge 215 is adjacent to a second side edge 156 of the package substrate 100 opposite to the first side edge 155. The first semiconductor die 210 may be disposed on the package substrate 100 to be closer to the first side edge 155 of the package substrate 100 rather than the second side edge 156 of the package substrate 100. Thus, a distance between the first side edge 215 of the first semiconductor die 210 and the first side edge 155 of the package substrate 100 may be less than a distance between the second side edge 216 of the first semiconductor die 210 and the second side edge 156 of the package substrate 100.

The first and second side edges 155 and 156 of the package substrate 100 may be parallel with the Y-axis direction when viewed from the X-Y plane. The first and second substrate edge regions 170 and 190 of the package substrate 100 may be located between the first and second side edges 155 and 156 of the package substrate 100 and may extend along the X-axis direction when viewed from the X-Y plane.

Referring to FIGS. 1 and 6, a second semiconductor die 220 of the semiconductor dies 200 may be disposed on the package substrate 100 such that second bonding pads 221 of the bonding pads 201 are adjacent to the second lands 112 of the package substrate 100. FIG. 6 is a plan view illustrating the second semiconductor die 220 vertically stacked on the first semiconductor die 210 and a lifting supporter 500 spaced apart from the second semiconductor die 220.

Referring to FIGS. 2 and 6, the second semiconductor die 220 may be vertically stacked on the first semiconductor die 210. The second semiconductor die 220 may be disposed to fully overlap with the first semiconductor die 210. Since the second semiconductor die 220 is vertically stacked on the first semiconductor die 210, a first side edge 225 of the second semiconductor die 220 may be aligned with the first side edge 215 of the first semiconductor die 210 and a second side edge 226 of the second semiconductor die 220 may be aligned with the second side edge 216 of the first semiconductor die 210.

Referring to FIGS. 5 and 6, a first edge region 222 of the second semiconductor die 220 may be located to be adjacent to the second substrate edge region 190 of the package substrate 100. The second semiconductor die 220 may be stacked on the first semiconductor die 210 such that the first edge region 222 of the second semiconductor die 220 is adjacent to the second substrate edge region 190 of the package substrate 100. The second bonding pads 221 of the second semiconductor die 220 may be electrically connected to the second lands 112 of the package substrate 100 through second bonding wires 320 of the bonding wires 300.

Referring to FIGS. 2 and 3, the second semiconductor die 220 may be attached to the first semiconductor die 210 using a first adhesive layer 450. The first adhesive layer 450 may be disposed between the first and second semiconductor dies 210 and 220 and may lift up (i.e., raise) the second semiconductor die 220 such that the second semiconductor die 220 is located at a certain level. The first adhesive layer 450 may include a penetration wafer backside lamination film. The first adhesive layer 450 may be much thicker than the fourth adhesive layer 410 attaching the first semiconductor die 210 to the package substrate 100.

Referring to FIGS. 3 and 6, since the second semiconductor die 220 vertically overlaps with the first semiconductor die 210, the first bonding pads 211 of the first semiconductor die 210 may be covered with the second semiconductor die 220. The first adhesive layer 450 may lift up and support the second semiconductor die 220 to prevent the first bonding wires 310 bonded to the first bonding pads 211 from contacting a backside surface 219 of the second semiconductor die 220. The first adhesive layer 450 may expand to cover the first bonding pads 211 and portions 311 of the first bonding wires 310. That is, the portions 311 of the first bonding wires 310 may be embedded in the first adhesive layer 450.

Referring to FIGS. 2 and 6, the lifting supporter 500 may be disposed on the first surface 101 of the package substrate 100. The lifting supporter 500 may be disposed at a side of a stack structure including the first and second semiconductor dies 210 and 220. The lifting supporter 500 may be disposed to be spaced apart from the stack structure of the first and second semiconductor dies 210 and 220 by a certain distance D in the X-axis direction. The lifting supporter 500 may be disposed on a region between the first and second substrate edge regions 170 and 190.

Referring again to FIG. 2, the lifting supporter 500 may be configured to include a second dummy semiconductor die. The lifting supporter 500 may be attached to the first surface 101 of the package substrate 100 using a fifth adhesive layer 420. The fifth adhesive layer 420 may have substantially the same thickness as the fourth adhesive layer 410. The lifting supporter 500 may have a thickness which is substantially equal to a total thickness of the first semiconductor die 210, the first adhesive layer 450 and the second semiconductor die 220. Thus, a top surface 429 of the lifting supporter 500 may be located at substantially the same level as a top surface 229 of the second semiconductor die 220.

Referring to FIGS. 2 and 7, a third semiconductor die 230 of the semiconductor dies 200 may be stacked on the lifting supporter 500. FIG. 7 illustrates a planar shape of the third semiconductor die 230. The third semiconductor die 230 may be attached to the second dummy semiconductor die corresponding to the lifting supporter 500 using a third adhesive layer 430. The third adhesive layer 430 may have substantially the same thickness as the fourth adhesive layer 410. The third adhesive layer 430 may have a thickness which is less than a thickness of the first adhesive layer 450. The lifting supporter 500 may be disposed between the third semiconductor die 230 and the package substrate 100. The lifting supporter 500 may lift up and support the third semiconductor die 230 to raise a level of the third semiconductor die 230.

The third semiconductor die 230 may be stacked on the lifting supporter 500 to partially overlap with the second semiconductor die 220. In such a case, a second edge region 293 of the third semiconductor die 230 may overlap with a second edge region 292 of the second semiconductor die 220 in an overlap region 290. As illustrated in FIG. 6, the second edge region 292 of the second semiconductor die 220 may be an edge region which is adjacent to the second side edge 226 of the second semiconductor die 220. The second edge region 292 of the second semiconductor die 220 may be an edge region extending in a direction intersecting a direction in which the first edge region 222 of the second semiconductor die 220 extends. That is, if the first edge region 222 of the second semiconductor die 220 extends in the X-axis direction, the second edge region 292 of the second semiconductor die 220 may extend in the Y-axis direction.

As illustrated in FIG. 7, the second edge region 293 of the third semiconductor die 230 may be an edge region adjacent to the second side edge 236 of the third semiconductor die 230. The second edge region 293 of the third semiconductor die 230 may be an edge region extending in a direction intersecting a direction in which a first edge region 232 of the third semiconductor die 230 extends. That is, if the first edge region 232 of the third semiconductor die 230 extends in the X-axis direction, the second edge region 293 of the third semiconductor die 230 may extend in the Y-axis direction.

Referring to FIGS. 2 and 7, since the second edge region 293 of the third semiconductor die 230 vertically overlaps with the second edge region 292 of the second semiconductor die 220, a width W of a stack structure of the second and third semiconductor dies 220 and 230 may be less than a sum of a width W2 of the second semiconductor die 220 and a width W3 of the third semiconductor die 230. The width W of the stack structure of the second and third semiconductor dies 220 and 230 may correspond to a value that remains after subtracting a width W1 of the overlap region 290 from a sum of the width W2 and the width W3. Since the width W of the stack structure of the second and third semiconductor dies 220 and 230 is less than a sum of the width W2 and the width W3, a width of the stack package 10 may also be reduced. In an embodiment, a stack package may include a stack structure having first and second stack structures providing the width W. For example, the first stack structure may include first and second (210 and 220) semiconductor dies that are stacked with each other and may have the second width W2. For example, the second stack structure may include third and fourth (230 and 240) semiconductor dies that are stacked with each other and may have the third width W3. For example, the first and second stack structures may vertically overlap with each other by the first width W1 to provide the width W of the stack structure which is the sum of the second and third widths (W2+W3) less the first width (W1). In an embodiment, the first stack structure may include bonding pads which may be laterally space apart from where the first and second stack structures vertically overlap with each other. As used herein, laterally spaced apart from where the first and second stack structures vertically overlap with each other means the bonding pads of the first stack structure are located outside of the region of vertical overlap.

Referring to FIGS. 4 and 7, the third semiconductor die 230 may include third bonding pads 231 that are disposed on the first edge region 232 to electrically connect the third semiconductor die 230 to the package substrate 100. The third bonding pads 231 may be arrayed along the X-axis direction in the first edge region 232 of the third semiconductor die 230 when viewed from a plan view. The third semiconductor die 230 may be stacked on the lifting supporter 500 such that the third bonding pads 231 are adjacent to the third lands 113 of the package substrate 100. The first edge region 232 of the third semiconductor die 230 may be located to be adjacent to the third land region 193 in the second substrate edge region 190 of the package substrate 100. The third bonding pads 231 of the third semiconductor die 230 may be electrically connected to the third lands 113 of the package substrate 100 through third bonding wires 330 of the bonding wires 300.

Referring to FIGS. 2 and 7, the third semiconductor die 230 may partially overlap with the second semiconductor die 220 to reveal the second bonding pads 221 disposed on the first edge region 222 of the second semiconductor die 220 located under the third semiconductor die 230. Thus, the second bonding wires 320 connected to the second bonding pads 221 of the second semiconductor die 220 may be spaced apart from the second side edge 236 of the third semiconductor die 230, as illustrated in FIG. 7. Since the second bonding wires 320 are located at a side of the third semiconductor die 230 to be spaced apart from the third semiconductor die 230, it may be unnecessary to dispose a thick adhesive layer such as a penetration wafer backside lamination (PWBL) film between the second and second semiconductor dies 220 and 230. Since the second bonding wires 320 are not disposed in the overlap region 290 between the second and third semiconductor dies 220 and 230, it may be unnecessary to dispose the PWBL film in the overlap region 290 to vertically separate the second bonding wires 320 from the third semiconductor die 230. Accordingly, a total thickness of a stack structure of the first to third semiconductor dies 210, 220 and 230 may be reduced because no PWBL film is disposed between the second and third semiconductor dies 220 and 230. Thus, a thickness of the stack package 10 may also be reduced.

As illustrated in FIG. 2, the third adhesive layer 430 may extend into the overlap region 290 between the second and third semiconductor dies 220 and 230. The third adhesive layer 430 may partially attach the third semiconductor die 230 to the second semiconductor die 220.

Referring to FIGS. 1 and 4, a fourth semiconductor die 240 of the semiconductor dies 200 may be stacked over the package substrate 100 such that fourth bonding pads 241 of the bonding pads 201 are adjacent to the fourth lands 114 of the package substrate 100. The fourth semiconductor die 240 may be stacked on the third semiconductor die 230 to vertically overlap with the third semiconductor die 230. The fourth semiconductor die 240 may be disposed to fully overlap with the third semiconductor die 230.

A first edge region 242 of the fourth semiconductor die 240 may be located to be adjacent to the first substrate edge region 170 of the package substrate 100. Referring to FIGS. 1, 4 and 7, the fourth semiconductor die 240 may be stacked on the third semiconductor die 230 such that the first edge region 242 of the fourth semiconductor die 240 is adjacent to the fourth land region 174 of the package substrate 100. The fourth bonding pads 241 of the fourth semiconductor die 240 may be electrically connected to the fourth lands 114 disposed on the fourth land region 174 in the first substrate edge region 170 of the package substrate 100 through fourth bonding wires 340 of the bonding wires 300.

The fourth bonding wires 340 may be disposed at one side of the fourth semiconductor die 240 opposite to the third bonding wires 330. Similarly, the second bonding wires 320 may be disposed at one side of the second semiconductor die 220 opposite to the first bonding wires 310. The first to fourth bonding wires 310, 320, 330 and 340 may have different lengths because the first to fourth semiconductor dies 210, 220, 230 and 240 are located at different levels.

Referring to FIGS. 2 and 4, the fourth semiconductor die 240 may be attached to the third semiconductor die 230 using a second adhesive layer 460. The second adhesive layer 460 may be substantially the same adhesive layer as the first adhesive layer 450. The second adhesive layer 460 may be disposed between the third and fourth semiconductor dies 230 and 240 and may lift up the fourth semiconductor die 240 such that the fourth semiconductor die 240 is located at a certain level. The second adhesive layer 460 may include a PWBL film. The second adhesive layer 460 may be much thicker than the third or fourth adhesive layer 430 or 410.

Referring to FIGS. 1, 4 and 7, since the fourth semiconductor die 240 vertically overlaps with the third semiconductor die 230, the third bonding pads 231 of the third semiconductor die 230 may be covered with the fourth semiconductor die 240. The second adhesive layer 460 may lift up and support the fourth semiconductor die 240 to prevent the third bonding wires 330 bonded to the third bonding pads 231 from contacting a backside surface 249 of the fourth semiconductor die 240. The second adhesive layer 460 may expand to cover the third bonding pads 231 and portions 331 of the third bonding wires 330. That is, the portions 331 of the third bonding wires 330 may be embedded in the second adhesive layer 460.

Referring to FIGS. 2 and 4, a molding layer 600 may be disposed on the first surface 101 of the package substrate 100 to cover the semiconductor dies 200 including the first to fourth semiconductor dies 210, 220, 230 and 240. The molding layer 600 may include an encapsulant material sealing the semiconductor dies 200. The molding layer 600 may be formed by molding an epoxy molding compound (EMC) material.

Referring to FIG. 2, the lifting supporter 500 may be disposed to be laterally spaced apart from the stack structure of the first and second semiconductor dies 210 and 220 by the certain distance D. The molding layer 600 may flow into a gap region between the lifting supporter 500 and the stack structure of the first and second semiconductor dies 210 and 220 during a molding process for forming the molding layer 600.

Referring to FIGS. 1, 6 and 7, the first to fourth bonding wires 310, 320, 330 and 340 may electrically connect the first to fourth bonding pads 211, 221, 231 and 241 to the first to fourth lands 111, 112, 113 and 114. Since the first to fourth bonding pads 211, 221, 231 and 241 are disposed on respective ones of the first to fourth semiconductor dies 210, 220, 230 and 240, the first to fourth bonding pads 211, 221, 231 and 241 may be distinct from each other. In addition, the first to fourth lands 111, 112, 113 and 114 may be disposed on the package substrate 100 and may be grouped to provide four distinct groups. Thus, the first to fourth lands 111, 112, 113 and 114 may provide four signal channels that are distinct from each other. That is, the first lands 111 may provide a first channel for signal transmission between the first semiconductor die 210 and the package substrate 100, and the second lands 112 may provide a second channel for signal transmission between the second semiconductor die 220 and the package substrate 100. Similarly, the third lands 113 may provide a third channel for signal transmission between the third semiconductor die 230 and the package substrate 100, and the fourth lands 114 may provide a fourth channel for signal transmission between the fourth semiconductor die 240 and the package substrate 100.

Referring to FIGS. 1 and 3, since the second semiconductor die 220 is stacked on the first semiconductor die 210, the second bonding wires 320 may be longer than the first bonding wires 310 and a loop height of the second bonding wires 320 may be greater than a loop height of the first bonding wires 310. In order that the second bonding wires 320 are stably connected to the second lands 112, the second lands 112 may be disposed to be farther from the second semiconductor die 220 as compared with the first lands 111. In order that the first bonding wires 310 are stably connected to the first lands 111, the first lands 111 may be disposed to be closer to the first semiconductor die 210 as compared with the second lands 112.

Referring to FIGS. 1 and 4, since the fourth semiconductor die 240 is stacked on the third semiconductor die 230, the fourth bonding wires 340 may be longer than the third bonding wires 330 and a loop height of the fourth bonding wires 340 may be greater than a loop height of the third bonding wires 330. In order that the fourth bonding wires 340 are stably connected to the fourth lands 114, the fourth lands 114 may be disposed to be farther from the fourth semiconductor die 240 as compared with the third lands 113. In order that the third bonding wires 330 are stably connected to the third lands 113, the third lands 113 may be disposed to be closer to the third semiconductor die 230 as compared with the fourth lands 114. Referring again to FIG. 4, outer connectors 106 may be attached to a second surface 102 of the package substrate 100 opposite to the lifting supporter 500. The outer connectors 106 may be connection members that electrically connect the package substrate 100 to an external device or an external system. The outer connectors 106 may include solder balls.

Figure 8:
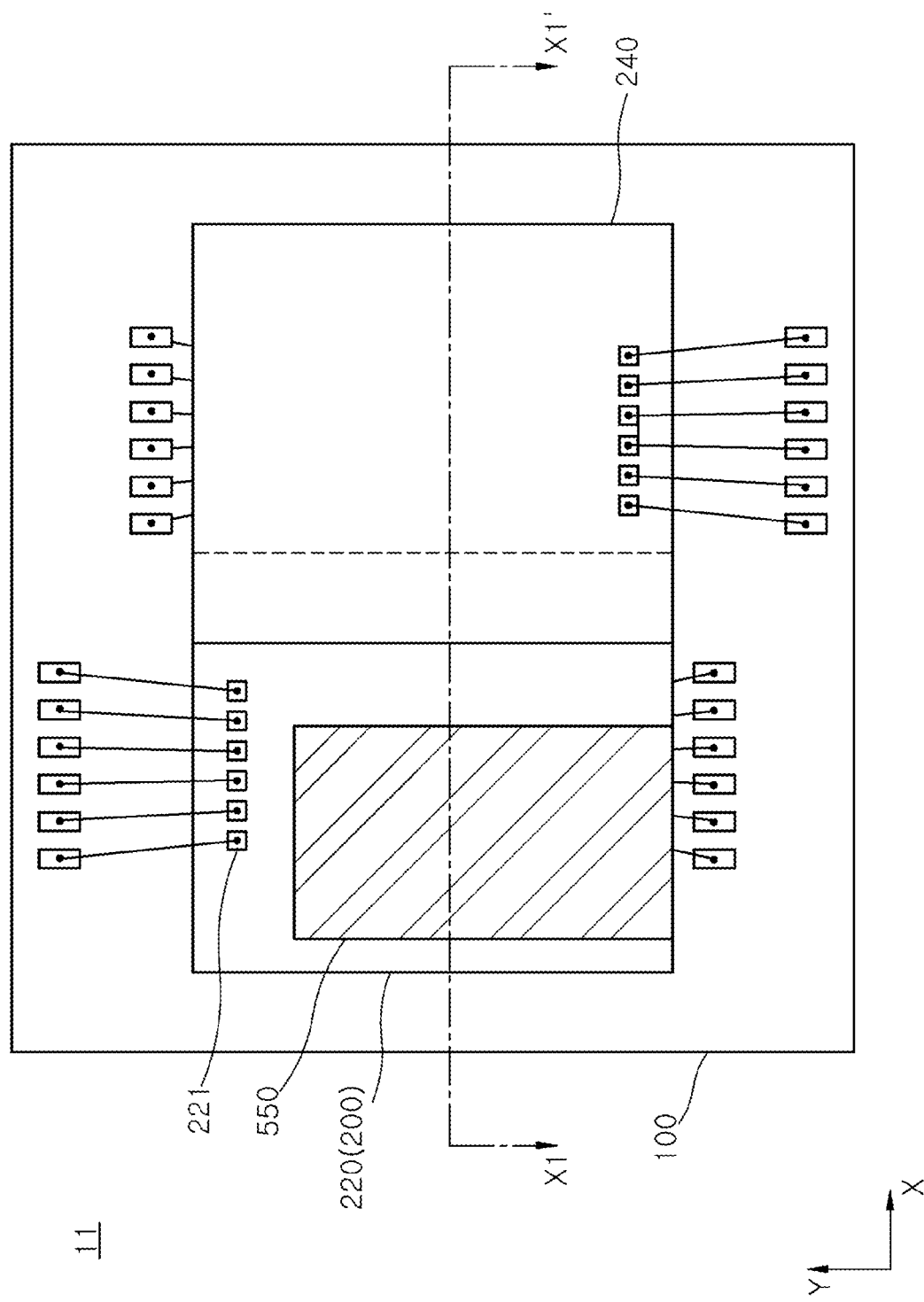
FIGS. 8 and 9 are plan view and a cross-sectional view of a stack package according to other embodiments, respectively.
Figure 9:
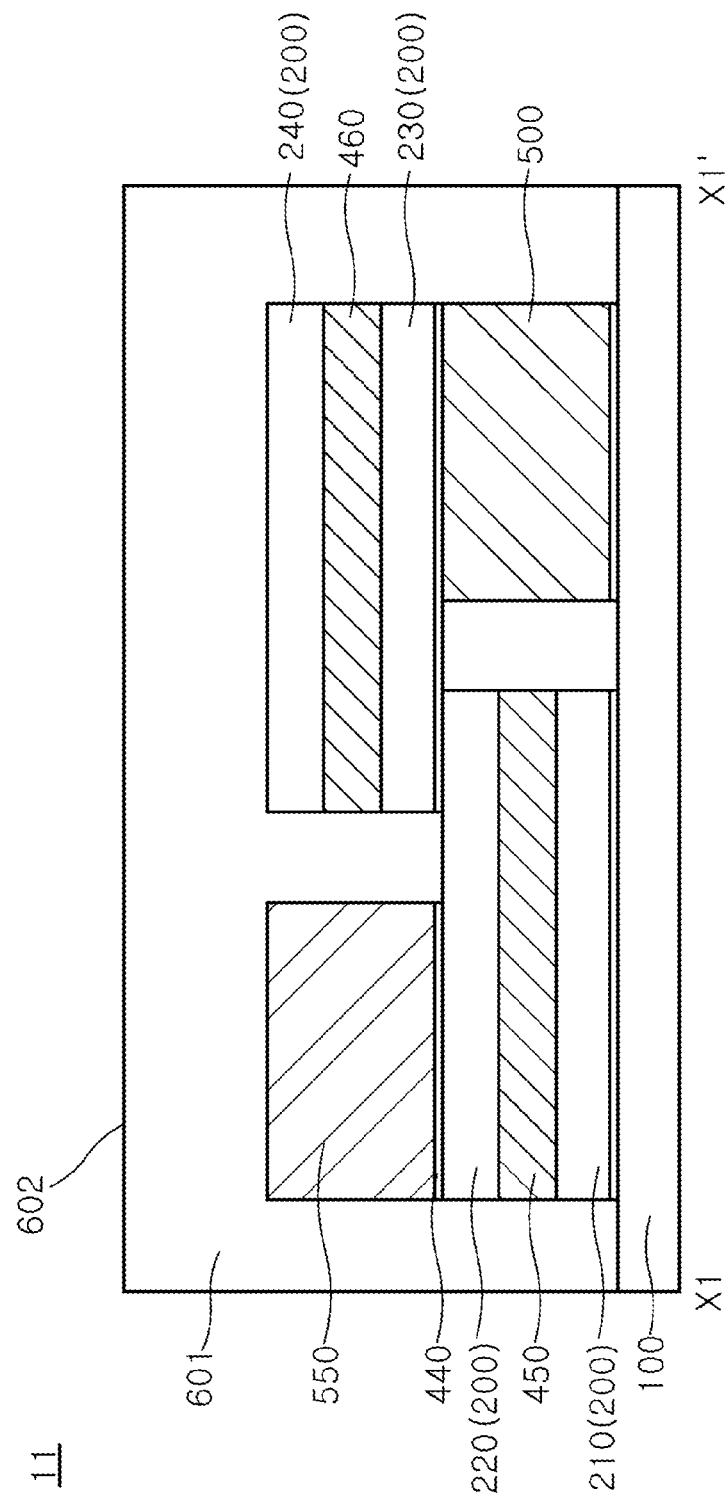

FIG. 8 is a plan view illustrating a stack package 11 according to other embodiments. FIG. 9 is a cross-sectional view taken along a line X1-X1' of FIG. 8. In FIGS. 8 and 9, the same reference numerals as used in FIGS. 1 to 7 may be construed as the same elements.

Referring to FIGS. 8 and 9, the stack package 11 may include the first to fourth semiconductor dies 210, 220, 230 and 240 which are vertically and sequentially stacked on the package substrate 100. The stack structure of the third and fourth semiconductor dies 230 and 240 may be partially stacked on the stack structure of the first and second semiconductor dies 210 and 220. That is, the stack structure of the third and fourth semiconductor dies 230 and 240 may partially overlap with the stack structure of the first and second semiconductor dies 210 and 220. A molding layer 601 may be disposed on a surface of the package substrate 100 to cover the first to fourth semiconductor dies 210, 220, 230 and 240.

A first dummy semiconductor die 550 may be disposed on the second semiconductor die 220 to be laterally spaced apart from the stack structure of the third and fourth semiconductor dies 230 and 240. The first dummy semiconductor die 550 may be spaced apart from the stack structure of the third and fourth semiconductor dies 230 and 240 by a certain distance. The first dummy semiconductor die 550 may be disposed to reveal the second bonding pads 221 of the second semiconductor die 220. The first dummy semiconductor die 550 may be attached to the second semiconductor die 220 using a sixth adhesive layer 440.

The first dummy semiconductor die 550 may have a thermal expansion coefficient which is substantially equal to a thermal expansion coefficient of the second semiconductor die 220. The first dummy semiconductor die 550 may include a silicon material. The first dummy semiconductor die 550 may have substantially the same thickness as the stack structure including the third semiconductor die 230, the second adhesive layer 460 and the fourth semiconductor die 240. The first dummy semiconductor die 550 may be disposed between a top surface 602 of the molding layer 601 and the second semiconductor die 220 to reduce a volume of the molding layer 601. Since the volume of the molding layer 601 is reduced due to the presence of the first dummy semiconductor die 550, a warpage phenomenon due to the molding layer 601, for example, an EMC material may be suppressed.

Figure 10:
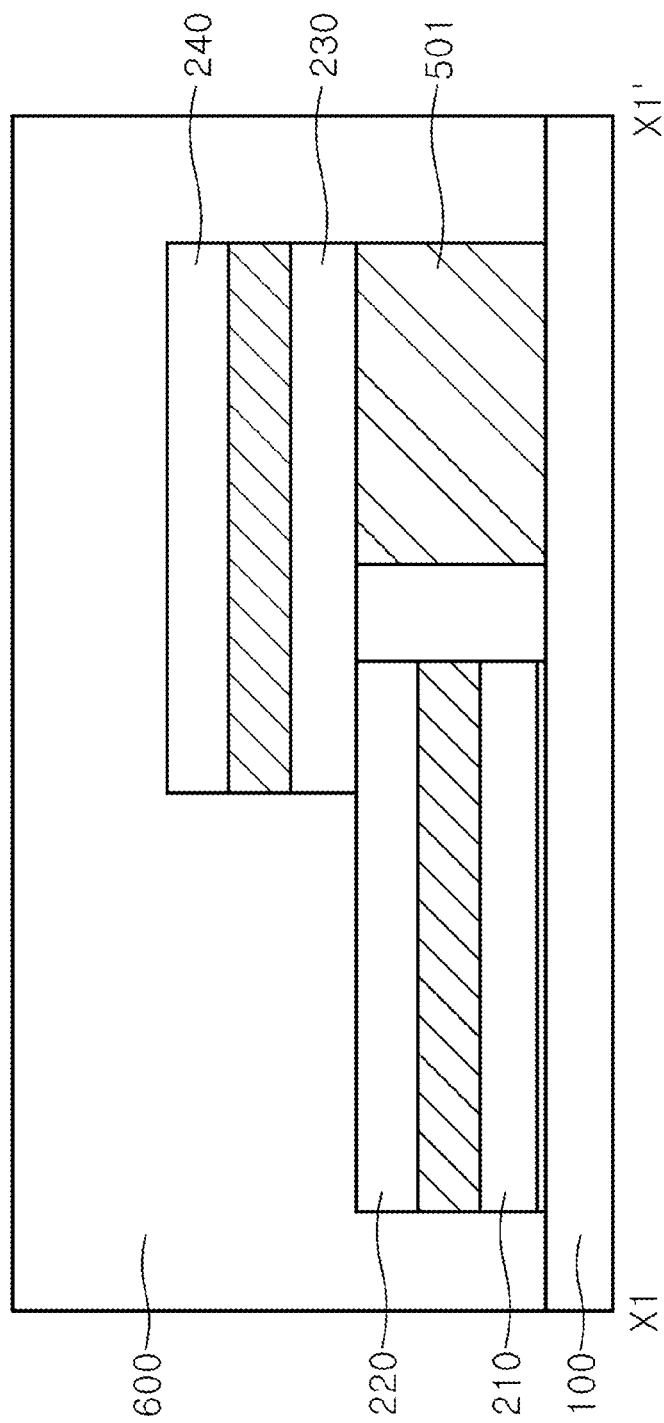
FIG. 10 is a cross-sectional view illustrating a stack package according to other embodiments.

FIG. 10 is a cross-sectional view illustrating a stack package 12 according to other embodiments. In FIG. 10, the same reference numerals as used in FIGS. 1 to 7 may be construed as the same elements.

Referring to FIG. 10, the stack package 12 may include the first to fourth semiconductor dies 210, 220, 230 and 240 which are vertically and sequentially stacked on the package substrate 100. The stack structure of the third and fourth semiconductor dies 230 and 240 may be partially stacked on the stack structure of the first and second semiconductor dies 210 and 220. That is, the stack structure of the third and fourth semiconductor dies 230 and 240 may partially overlap with the stack structure of the first and second semiconductor dies 210 and 220. The molding layer 600 may be disposed on a surface of the package substrate 100 to cover the first to fourth semiconductor dies 210, 220, 230 and 240.

A lifting supporter 501 may be disposed between the third semiconductor die 230 and the package substrate 100. The lifting supporter 501 may include a solder resist layer, a polymer layer, an adhesive layer or a dielectric layer. The lifting supporter 501 may support the third semiconductor die 230.

According to the embodiments described above, a plurality of semiconductor dies may be stacked to provide a stack package and at least two groups of the semiconductor dies may partially overlap with each other. As a result, the stack package may have a relatively reduced width and a relatively reduced thickness.

Figure 11:
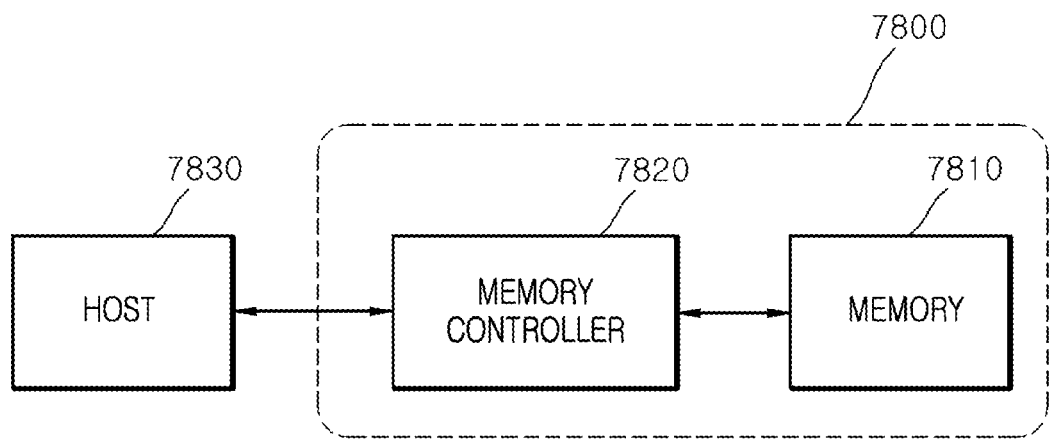
FIG. 11 is a block diagram illustrating an electronic system employing a memory card including at least one of stack packages according to various embodiments.

FIG. 11 is a block diagram illustrating an electronic system including a memory card 7800 employing at least one of the stack packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the stack packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 12:
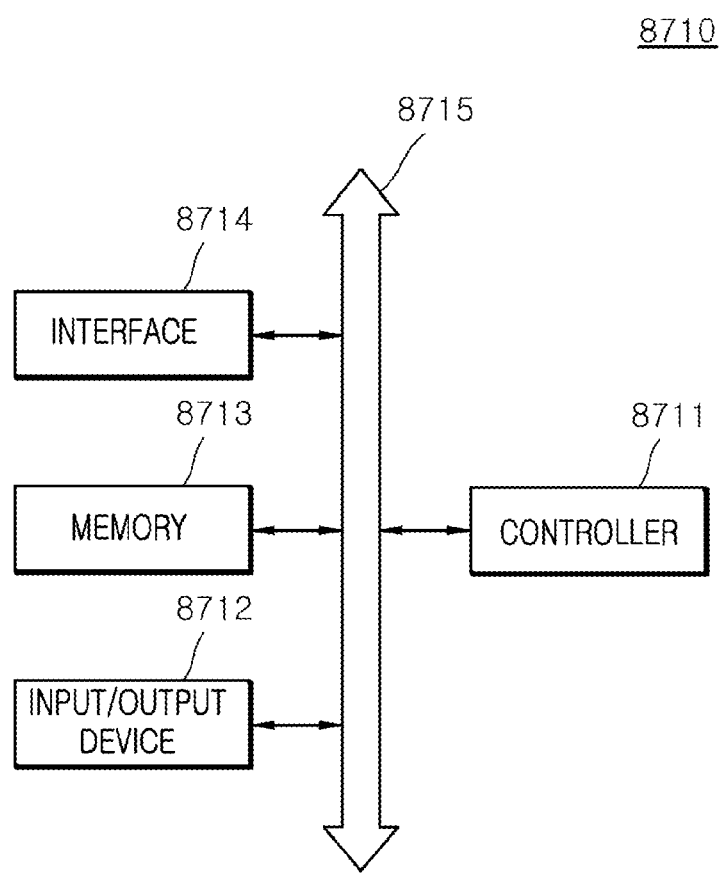
FIG. 12 is a block diagram illustrating another electronic system including at least one of stack packages according to various embodiments.

FIG. 12 is a block diagram illustrating an electronic system 8710 including at least one of the stack packages according to the embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include the stack package according to the embodiment of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:
1. A stack package comprising:
 a first semiconductor die disposed on a package substrate, which includes first bonding pads;
 a second semiconductor die fully overlapping the first semiconductor die and including second bonding pads disposed on a first edge region of the second semiconductor die;
 first bonding wires electrically connecting the first bonding pads to the package substrate;
 a first adhesive layer disposed between the first and second semiconductor dies to raise the second semiconductor die and the first adhesive layer expanding to cover the first bonding pads and portions of the first bonding wires bonded to the first bonding pads;

a third semiconductor die having a second edge region, which vertically overlaps a second edge region of the second semiconductor die and including third bonding pads disposed on a first edge region of the third semiconductor die, wherein the second edge regions of the second and third semiconductor dies extend in a Y-axis direction and the first edge regions of the second and third semiconductor dies extend in an X-axis direction from an X-Y plane;

a fourth semiconductor die vertically stacked on the third semiconductor die to include fourth bonding pads;

second bonding wires directly connecting the third bonding pads to the package substrate;

a second adhesive layer disposed between the third and fourth semiconductor dies to raise the fourth semiconductor die and expanding to cover the third bonding pads and portions of the second bonding wires bonded to the third bonding pads; and a lifting supporter disposed between the third semiconductor die and the package substrate to raise the third semiconductor die.

2. The stack package of claim 1, wherein the third semiconductor die partially overlaps with the second semiconductor die to reveal the second bonding pads of the second semiconductor die.

3. The stack package of claim 2, further comprising:

third bonding wires electrically connecting the second bonding pads to the package substrate, the third bonding wires being located at a side of the second semiconductor die opposite to the first bonding wires; and fourth bonding wires electrically connecting the fourth bonding pads to the package substrate, the fourth bonding wires being located at a side of the fourth semiconductor die opposite to the second bonding wires.

4. The stack package of claim 3, wherein the third bonding wires are bonded to the second bonding pads and extend to be spaced apart from the third semiconductor die.

5. The stack package of claim 2, further comprising a first dummy semiconductor die that is disposed on the second semiconductor die to be spaced apart from the third and fourth semiconductor dies.

6. The stack package of claim 5, further comprising a molding layer covering the first to fourth semiconductor dies and the first dummy semiconductor die.

7. The stack package of claim 2, wherein the lifting supporter is disposed on the package substrate to be laterally spaced apart from the first and second semiconductor dies.

8. The stack package of claim 2, wherein the lifting supporter has substantially the same thickness as a stack structure including the first and second semiconductor dies and the first adhesive layer.

9. The stack package of claim 2, wherein the lifting supporter includes a dummy semiconductor die which is attached to the third semiconductor die using a third adhesive layer.

10. The stack package of claim 9, wherein the third adhesive layer has a thickness which is less than a thickness of the first and second adhesive layers.

11. The stack package of claim 9, wherein the third adhesive layer extends into an interface between the second edge region of the third semiconductor die and the second edge region of the second semiconductor die to attach the third semiconductor die to the second semiconductor die.

* * * * *